(12) United States Patent
Anker et al.

(10) Patent No.: US 9,207,704 B2
(45) Date of Patent: Dec. 8, 2015

(54) GLITCHLESS CLOCK SWITCHING THAT HANDLES STOPPED CLOCKS

(71) Applicant: Silicon Laboratories Inc., Austin, TX (US)

(72) Inventors: William J. Anker, Londonderry, NH (US); Srisai R. Seethamraju, Nashua, NH (US)

(73) Assignee: Silicon Laboratories, Inc., Austin, TX (US)

( * ) Notice: Subject to any disclaimer, the term of this patent is extended or adjusted under 35 U.S.C. 154(b) by 512 days.

(21) Appl. No.: 13/662,165

(22) Filed: Oct. 26, 2012

(65) Prior Publication Data

US 2014/0118033 A1    May 1, 2014

(51) Int. Cl.
*G06F 1/08* (2006.01)
*G06F 1/04* (2006.01)
*H03K 5/1252* (2006.01)

(52) U.S. Cl.
CPC .............. *G06F 1/04* (2013.01); *H03K 5/1252* (2013.01)

(58) Field of Classification Search
CPC .......................................................... G06F 1/08
USPC ................................................ 327/99; 326/96
See application file for complete search history.

(56) References Cited

U.S. PATENT DOCUMENTS

| | | | | |
|---|---|---|---|---|
| 5,274,678 | A * | 12/1993 | Ferolito et al. | 375/357 |
| 5,623,223 | A * | 4/1997 | Pasqualini | 327/298 |
| 6,275,546 | B1 * | 8/2001 | Miller et al. | 375/354 |
| 6,795,932 | B2 * | 9/2004 | Ohkawa | 713/600 |
| 6,816,023 | B1 | 11/2004 | Currier et al. | |
| 7,405,628 | B2 | 7/2008 | Hulfachor et al. | |

* cited by examiner

*Primary Examiner* — William Hernandez
(74) *Attorney, Agent, or Firm* — Abel Law Group, LLP

(57) ABSTRACT

An integrated circuit receives a first and second clock signal and a select signal that selects one of the clock signals. A glitchless switching circuit supplies an output clock signal according to which of the first and second clocks is selected by the select signal. A reset circuit coupled to the glitchless switching circuit responds to a direction of a transition of the select signal and generates a first reset signal in response to a first direction of the transition and generates a second reset signal in response to a second direction of the transition. The reset pulses are supplied respectively to first and second paths in the glitchless switching circuit to reset the state machine formed by the first and second paths in the event one of the input clocks is absent.

20 Claims, 3 Drawing Sheets shown for N=8

GLITCHLESS CLOCK SWITCHING THAT HANDLES STOPPED CLOCKS

BACKGROUND

1. Field of the Invention

This invention relates to clock signals and more particularly to switching between clock signals.

2. Description of the Related Art

In clocking systems, a clock buffer circuit may receive several input clocks and supply a selected one of those clocks to additional circuitry in the system. Sometimes it is desirable to switch between input clocks. The desire to switch may be due to one of the clocks failing or the system requiring a different frequency of operation. When switching between clocks, a glitchless switch relies on both inputs toggling in order to perform the switch without glitches. When one of the input clocks stops or nearly stops, the switching circuit can get stuck as explained further herein. A loss-of-signal (LOS) detector is typically used to free the stuck switch. The LOS detector detects when one of the clocks has stopped toggling or toggles below a threshold rate. There are drawbacks to using the LOS approach. First, the LOS circuit has some cost to it which includes physical area. Secondly, LOS detection is a lagging indicator of the input clock's situation, which can cause the switching to not be glitchless, particularly upon exiting LOS. Third, an LOS detection circuit typically utilizes a threshold frequency or trip threshold, below which, LOS will be declared even though the clock is running For frequencies from DC to the threshold frequency, the clock switch will not be glitchless. Finally, circuits using LOS typically require a continuously running system clock. That system clock may contribute to increased output clock noise and jitter. Thus, there is a need to address the shortcomings of utilization of a LOS circuit.

SUMMARY OF EMBODIMENTS OF THE INVENTION

One embodiment provides a method for receiving a transition of a select signal indicating to switch from generating an output clock signal using a first clock input signal to generating the output clock signal using a second clock signal. A first reset signal is generated based on the transition of the select signal. The first reset signal is supplied to a first circuit controlling a first path used by the first clock signal.

In another embodiment an integrated circuit includes a first circuit to generate an output clock signal from one of a first clock signal and a second clock signal according to a value of a select signal. A second circuit is responsive to a direction of a transition of the select signal to generate a first reset signal in response to a first direction of the transition and to generate a second reset signal in response to a second direction of the transition, the first and second reset signals coupled to reset, respectively, a first and a second portion of the first circuit.

In another embodiment a method includes receiving a select signal indicating to switch from generating an output clock signal in a glitchless switching circuit using a first received clock input signal to generating the output clock signal using a second received clock signal. A first reset signal is generated responsive to a transition of the select signal in a first direction and a second reset signal is generated responsive to a transition of the select signal in a second direction. One of the first and second reset signals is supplied to the glitchless switching circuit according the direction of transition of the select signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
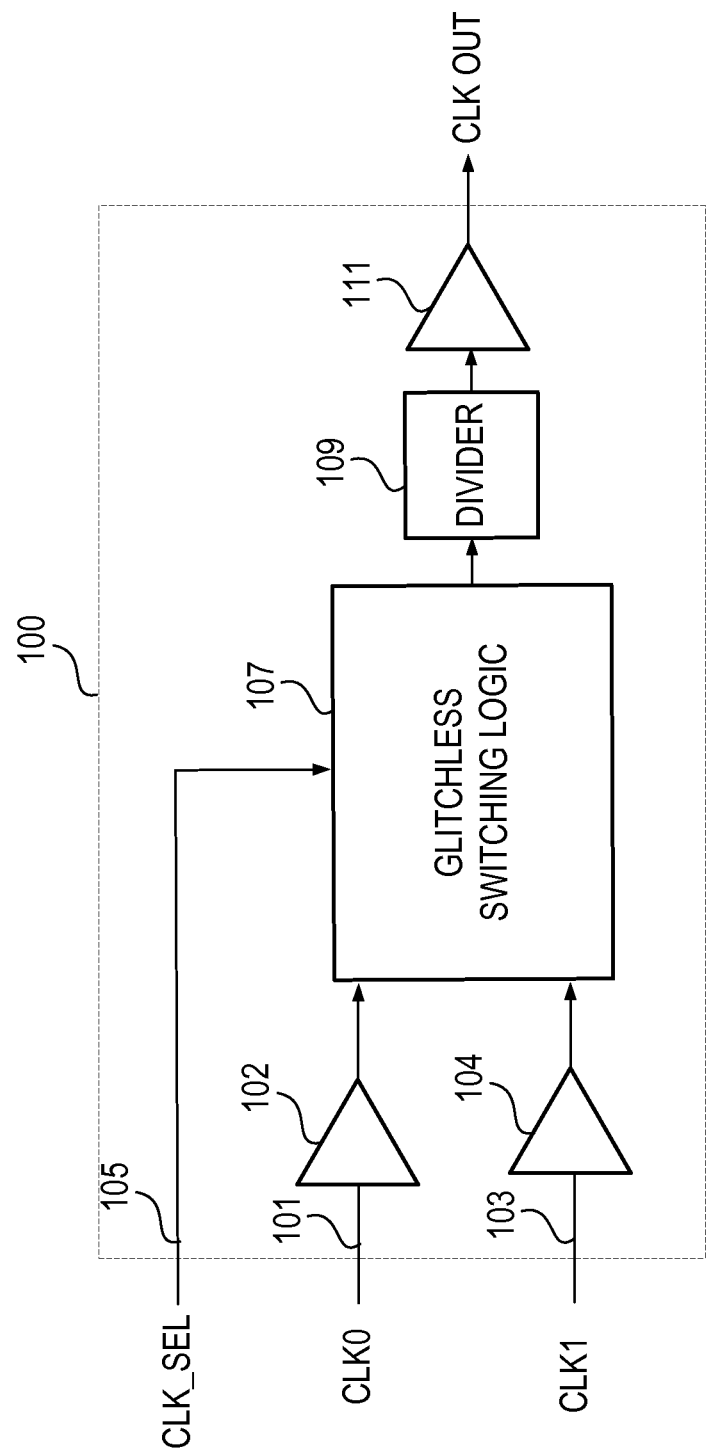
FIG. 1 illustrates a high level diagram of a clock buffer circuit.

Referring to FIG. 1, illustrated is a high level block diagram of a clock buffer integrated circuit 100 according to an embodiment. The clock buffer 100 receives a first clock 101 (CLK0) in receiver buffer 102 and a second clock 103 (CLK1) in receive buffer 104. In addition, the clock buffer 100 also receives a clock select signal 105 (CLK_SEL) that selects which of the clocks CLK0 or CLK1 is to be used. The clocks are supplied to the glitchless switching logic 107, described further herein, which outputs the selected clock to an optional divider 109, which in turn supplies the selected clock to output buffer 111 as the output clock signal. Note that while two clocks are shown and one select line, the number of clocks received and the number of clocks supplied may vary in different embodiments.

Figure 2:
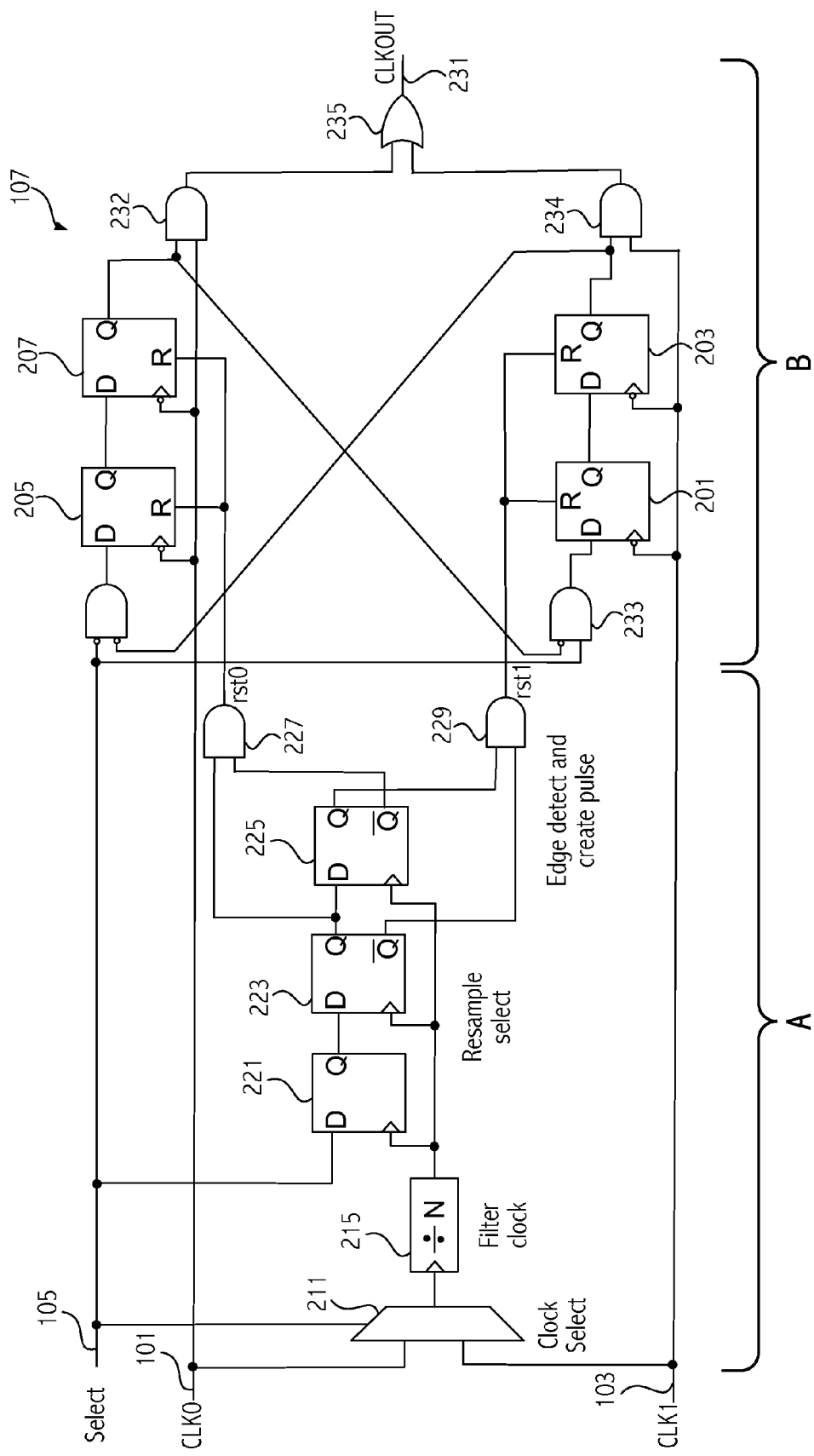
FIG. 2 illustrates additional details of glitchless switching logic including logic to generate reset signals according to an embodiment of the invention.

FIG. 2 shows additional details of the glitchless switching logic 107. The glitchless switching logic 107 includes a basic glitchless switching circuit as seen in FIG. 2, side B. On side B, the cross-coupled flip-flops 201, 203, 205, and 207 cleanly resample the "select" signal, and, form a sequencing state machine that uses both input clocks. There are variations on this arrangement. In prior art approaches it is common to bring a loss-of-signal (LOS) indication into the side B circuit to un-stick the state machine in the event of a stopped input clock. The embodiment illustrated in FIG. 2, avoids the "lagging indicator" drawback of a LOS approach. Further, the embodiment illustrated in FIG. 2 does not have the "trip threshold" drawback where frequencies below a threshold frequency are considered to be a loss of signal condition if clocks are running slowly. Nor does the embodiment of FIG. 2 require an additional "system" clock. Thus, there is no asynchronous energy present to degrade the output clock.

In normal operation, the select signal selects the top or bottom path to provide the clock signal used as the output clock signal 231 (CLKOUT) supplied from OR gate 235. The top path is controlled by flip-flops 205 and 207 and the bottom path is controlled by flip-flops 201 and 203. With the select signal at a logical zero, the top path is selected and flip-flops 205 and 207 both output a logical high signal and AND gate 232 allows CLK0 to pass through as the output clock signal CLKOUT. The select signal 105 being at a logical zero forces the bottom flip-flops 201 and 203 to supply a logical zero forcing the output of AND gate 234 to a logical zero. If the select signal is a logical one, the bottom path passes CLK1, which is used as the output clock signal 231 (CLKOUT).

Assume that CLK0 101 is the selected clock and is being supplied as the CLKOUT signal 231. With select signal 105 at a logical zero, the output of flip-flop 207 is a logical one, which forces AND gate 233 (in the bottom path) to output a logical zero, which keeps flip-flops 201 and 203 at zero which prevents CLK1 from being supplied to OR gate 235. If CLK0 stops, flip-flop 207 can get stuck outputting a logical one, which prevents CLK1 103 from being supplied to OR gate 235 even when the select signal changes to a logical one. In such circumstances a LOS signal has been used to unstick the state machine formed by the flip-flops on side B.

Rather than use a LOS signal, embodiments of the invention use the reset input (R) of the flip-flops to un-stick the state machine in the event of a stopped clock. Shortly after the select signal 105 changes state, a reset pulse is applied to the flip-flops on the non-selected side of the state machine, either flip-flops 205 and 207 or flip-flops 201 and 203. If the side to be reset still has its clocks running, those flip-flops will already be in the reset state and the reset pulse will have no effect. If the side to be reset has its clock stopped, which can stall the state machine, the reset pulse will reset the flip-flops and allow the state machine to continue on to activate the selected clock, glitchlessly. Note that this both un-sticks the state machine and glitchlessly switches to the selected clock.

To generate the reset pulses to unstick the state machine on side B, an embodiment utilizes the reset circuit on side A of deglitching circuit 107. The two clocks 101 and 103 are supplied to a multiplexer circuit 211. The select signal 105 functions as the select signal for multiplexer 211, which selects one of the input clocks. Any glitches that may occur at the output of the multiplexer 211 are next filtered in ripple counter 215 that provides a divide-by-N. This smoothed clock is used to sample the "select" signal 105. The sampled "select" signal is edge-detected for both positive and negative going edges. A pulse is created from the edge-detector and pulse generator circuit formed by flip-flops 223 and 225 and AND gates 227 and 229. That circuit supplies a reset pulse to the unselected side's flip flops. If, for example, the select signal 105 goes from zero to one the AND gate 227 supplies a reset pulse to flip-flops 205 and 207 to reset the flip-flops. The reset pulse only needs to be long enough to reset the flip-flops. If the select signal 105 goes from a one to a zero, the AND gate 229 supplies a reset pulse to flip-flops 201 and 203.

Because a reset pulse is being applied to the non-selected side's flip-flops, a change in "select" back to that clock before the reset occurs could compromise the glitchless switching. That means that for glitchless switching, the toggle rate of "select" should be less than (frequency of the slowest input clock)/(2N) for the particular embodiment shown in FIG. 2, where N is the divide value of the ripple counter 215. Also, for glitchless switching, the frequencies of the two input clocks should have a ratio of not more than N/2 for the implementation shown for the embodiment of FIG. 2. In embodiments, N may be 8 or greater to effectively filter potential glitches from multiplexer 211. Alterations in either side A or side B can change these limitations.

Figure 3:
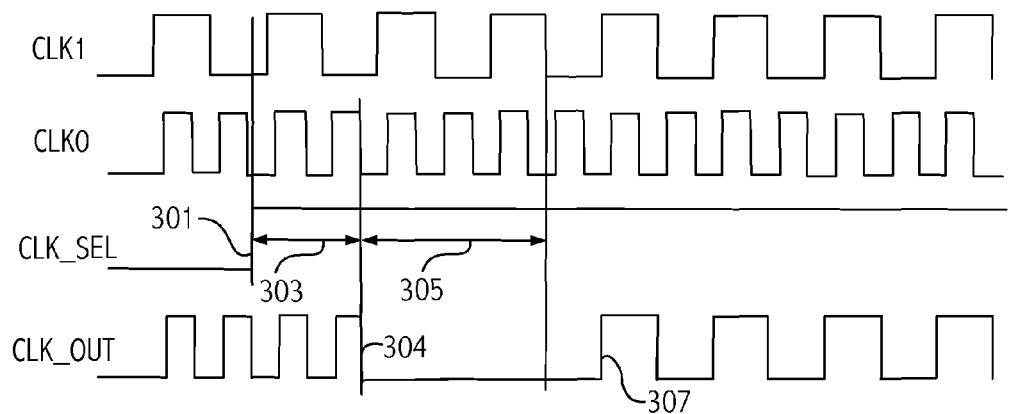
FIG. 3 illustrates a timing diagram illustrating switching between input clocks according to an embodiment of the invention.

FIG. 3 illustrates a timing diagram illustrating operation of an embodiment of the invention. Note that the circuit of FIG. 2 can support switching between clocks at the same frequency, and switching between clocks that are of different frequencies. FIG. 3 illustrates switching between clocks at different frequencies. As shown in FIG. 3, when select changes at 301 from a logical zero to a logical one, the clock output continues at 303 for two negative clock edges of the previously selected clock, here CLK0. The output clock (CLK_OUT) stops at 304, at the negative going edge of CLK0, thus stopping the output clock without a glitch. The output clock signal (CLK_OUT) remains disabled through the next two falling edges of the newly selected clock (CLK1) as shown at 305, after which the CLK_OUT output starts with the rising edge of the newly selected clock CLK1 coming at 307 without a glitch. Note that if the clock switch is to an inactive clock, the output will stop without a glitch and wait for edges of the newly selected clock. The clock may also switch from an absent clock to an active clock.

Figure 4:
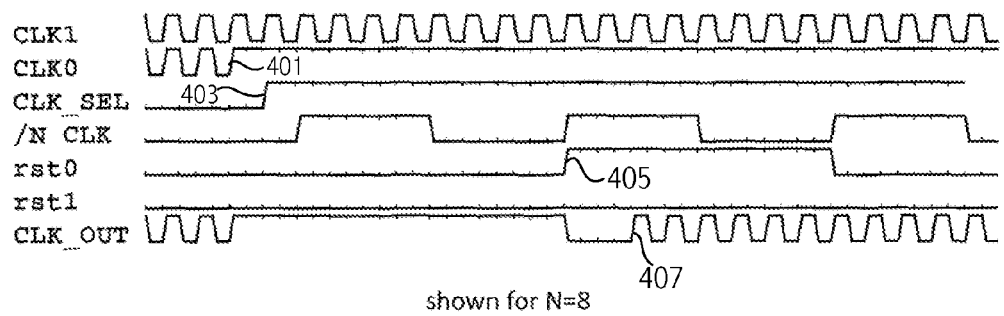
FIG. 4 illustrates operation of the clock switch where one of the clocks has stopped.

While FIG. 3 illustrates operation of the clock switch without a need for a reset pulse (not shown in FIG. 3), a reset pulse (rst0) is still generated resetting the CLK0 clock path. FIG. 4 illustrates operation of the clock switch where one of the clocks has stopped and the reset pulse is needed to accomplish the clock switch. Referring to FIG. 4, CLK0 and CLK1 have the same frequency. CLK0 stops at 401. The select line changes at 403 to select CLK1. However, because CLK0 is stuck high, flip-flops 205 and 207 never transition preventing CLK1 from being output. FIG. 4 assumes N=8 is the divide value for ripple counter 215. Thus, at the second rising edge of the clock output by counter 215, the reset pulse rst0 is asserted at 405, resetting the CLK0 path and allowing the CLK_OUT to begin supplying CLK1 with the first rising edge shown at 407.

The description of the invention set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. A method comprising:
   generating an output clock signal using one of a first clock signal and a second clock signal;
   receiving a transition of a select signal indicating to switch from generating the output clock signal using the one of the first clock signal and the second clock signal to generating the output clock signal using another of the first clock signal and the second clock signal;
   generating a first reset signal responsive to a direction of the transition of the select signal being in a first direction;
   generating a second reset signal responsive to the direction of the transition of the select signal being in a second direction;
   supplying the first reset signal to reset a first circuit forming a first path used by the first clock signal if the direction of the transition is in the first direction; and
   supplying the second reset signal to reset a second circuit forming a second path used by the second clock signal if the direction of the transition is in the second direction.

2. The method as recited in claim 1 wherein one of the first and second clock signals is inactive when the transition occurs.

3. The method as recited in claim 1 further comprising:
   generating the first reset signal using a filtered clock signal based on the second clock signal.

4. The method as recited in claim 3 further comprising filtering the second clock signal in a ripple counter to generate the filtered clock signal.

5. The method as recited in claim 1 further comprising:
   generating the second reset signal using a filtered clock signal based on the first clock signal.

6. The method as recited in claim 1 receiving the first and second clock signals at a multiplexer circuit and generating a multiplexer output according to the select signal.

7. The method as recited in claim 1 further comprising resampling the select signal.

8. The method as recited in claim 7 further comprising detecting an edge of the select signal.

9. The method as recited in claim 8 further comprising creating a first pulse based on a detected first edge of the select signal and using the first pulse as the first reset signal.

10. The method as recited in claim 8 further comprising creating a second pulse based on a detected second edge of the select signal and using the second pulse as the second reset signal.

11. The method as recited in claim 1 further comprising receiving the first and second clock signals and the select signal at input terminals of an integrated circuit and supplying the output clock signal from the integrated circuit.

12. An integrated circuit comprising:
a glitchless switching circuit to generate an output clock signal from one of a first clock signal and a second clock signal according to a value of a select signal; and
a reset circuit responsive to a direction of a transition of the select signal to generate a first reset signal in response to a first direction of the transition and to generate a second reset signal in response to a second direction of the transition, the first and second reset signals coupled to reset, respectively, a first and a second portion of the glitchless switching circuit.

13. The integrated circuit as recited in claim 12 wherein the glitchless switching circuit is operable to switch from using one of the first and second clock signals to using another of the first and second clock signals to generate the output clock signal according to the transition of the select signal.

14. The integrated circuit as recited in claim 12 wherein the reset circuit further comprises a filter circuit to generate a filtered clock signal from one of the first and second clock signals selected according to the value of the select signal.

15. The integrated circuit as recited in claim 14 wherein the filter circuit is a ripple counter.

16. The integrated circuit as recited in claim 14 wherein the reset circuit further comprises a multiplexer coupled to receive the first and second clocks and supply a selected clock signal to the filter circuit according to the select signal.

17. The integrated circuit as recited in claim 14 wherein the reset circuit further comprises:
a resampling circuit to resample the select signal using the filtered clock signal; and
an edge detect circuit coupled to the resampling circuit to detect the transition of the select signal.

18. The integrated circuit as recited in claim 17 wherein the edge detect circuit is responsive to the first direction of the transition to create a first pulse signal as the first reset signal and is responsive to the second direction of the transition to generate a second pulse signal as the second reset signal.

19. The integrated circuit as recited in claim 14 wherein the first portion of the glitchless switching circuit includes a first and a second flip-flop and the second portion includes a third and fourth flip-flop, wherein the first and second flip-flop have respective reset inputs coupled to the first reset signal and the third and fourth flip-flops have respective reset inputs coupled to the second reset signal.

20. A method comprising:
receiving a select signal indicating to switch from generating an output clock signal in a glitchless switching circuit using a first received clock signal to generating the output clock signal using a second received clock signal;
generating a first reset signal responsive to a transition of the select signal being in a first direction to reset a first path used for one of the first and second clock signals in the glitchless switching circuit;
generating a second reset signal responsive to the transition of the select signal being in a second direction to reset a second path used for another of the first and second clock signals in the glitchless switching circuit.

* * * * *